(12) United States Patent
Shin et al.

(10) Patent No.: US 9,767,882 B2
(45) Date of Patent: Sep. 19, 2017

(54) METHOD OF REFRESHING MEMORY DEVICE

(71) Applicant: Samsung Electronics Co., Ltd., Suwon-si (KR)

(72) Inventors: Seung-jun Shin, Incheon (KR); Tae-young Oh, Suwon-si (KR); Kwang-il Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/258,174

(22) Filed: Sep. 7, 2016

(65) Prior Publication Data

US 2017/0069371 A1    Mar. 9, 2017

(30) Foreign Application Priority Data

Sep. 9, 2015  (KR) ........................ 10-2015-0127706

(51) Int. Cl.
*G11C 7/00* (2006.01)
*G11C 11/406* (2006.01)

(52) U.S. Cl.
CPC ............................. *G11C 11/40615* (2013.01)

(58) Field of Classification Search
CPC ............ G11C 11/406; G11C 11/40615; G11C 11/40611

USPC ........................................................ 365/222
See application file for complete search history.

(56) References Cited

U.S. PATENT DOCUMENTS

| | | | |
|---|---|---|---|
| 5,335,202 A | 8/1994 | Manning et al. | |
| 5,365,487 A | 11/1994 | Patel et al. | |
| 5,566,117 A | 10/1996 | Okamura et al. | |
| 5,862,093 A | 1/1999 | Sakakibara | |
| 6,260,149 B1 | 7/2001 | Baweja | |
| 6,741,515 B2 | 5/2004 | Lazar et al. | |
| 6,757,207 B1 | 6/2004 | Lazar | |
| 6,834,021 B2 | 12/2004 | Mori et al. | |
| 6,922,369 B2 | 7/2005 | Kim | |
| 7,907,464 B2 | 3/2011 | Oh | |
| 8,988,961 B2 | 3/2015 | Hwang | |
| 2009/0083479 A1* | 3/2009 | Lee ...................... | G11C 7/1075 711/106 |

* cited by examiner

*Primary Examiner* — Huan Hoang
(74) *Attorney, Agent, or Firm* — Muir Patent Law, PLLC

(57) ABSTRACT

A method of refreshing a memory device includes performing normal refresh operations on memory cell rows in response to a refresh command and performing self-refresh operations on the memory cell rows according to a refresh clock signal in response during a self-refresh mode of the memory device between a self-refresh enter command and a self-refresh exit command. The refresh clock signal has a first self-refresh cycle before the self-refresh begins and a second self-refresh cycle, which may be longer than the first self-refresh cycle, after the self-refresh begins. In some examples, no self-refresh may be performed by the memory device during a self-refresh mode.

19 Claims, 13 Drawing Sheets

METHOD OF REFRESHING MEMORY DEVICE

CROSS-REFERENCE TO RELATED APPLICATION

This application claims the benefit of Korean Patent Application No. 10-2015-0127706, filed on Sep. 9, 2015, in the Korean Intellectual Property Office, the disclosure of which is incorporated herein in its entirety by reference.

BACKGROUND

The inventive concept relates to a memory device, and more particularly, to a method of refreshing a memory device, whereby refresh power may be reduced.

A volatile memory device, such as dynamic random access memory (DRAM), performs a refresh operation to maintain stored data. DRAM performs auto-refresh to generate a refresh row address in response to a periodically externally received refresh command and refreshes a memory cell row corresponding to the refresh row address. Also, DRAM performs self-refresh upon entering a self-refresh mode in response to a self-refresh enter (SRE) command to refresh memory cell rows in response to a built-in timer in the self-refresh mode. When auto-refresh and self-refresh are performed with all-bank refresh (ABR) and the SRE command is frequently issued, refresh operations are often performed more frequently than is necessary for data retention. Accordingly, refresh time of the DRAM unnecessarily increases, refresh power consumption increases and the DRAM performance may be degraded.

SUMMARY

The inventive concept provides a method of refreshing a memory device, whereby refresh power may be reduced. According to an aspect of the inventive concept, there is provided a method of refreshing a memory device comprising performing normal refresh operation on memory cell rows of the memory device in response to a refresh command received from an external source, and performing a self-refresh operation on the memory cell rows according to a refresh clock signal generated by a refresh clock signal generator of the memory device, the refresh clock signal providing a timing of a refresh period of the memory cell rows during a self-refresh period extending between a self-refresh enter command received from the external source and a self-refresh exit command received from an external source. The refresh clock signal may have a first self-refresh cycle before the self-refresh operation begins and a second self-refresh cycle after the self-refresh operation begins, where durations of the first self-refresh cycle and the second self-refresh cycle are different from each other.

The second self-refresh cycle may be longer than the first self-refresh cycle.

The method may comprise resetting the refresh clock signal during a normal refresh period immediately prior to the self-refresh period in response to a refresh command received from an external source.

The method may comprise changing a cycle of the refresh clock signal. A start time of the self-refresh operation may be responsive to the change of the cycle of the refresh clock signal.

The method may comprise restarting a cycle of the refresh clock signal. The self-refresh operation may be the first self-refresh operation performed during the self-refresh period, and the start time of the self-refresh operation may occur after a delay from receipt of the self-refresh enter command.

The normal refresh operation may be performed within a standard refresh period of the memory device.

The method may comprise receiving an extra refresh command from the external source between the self-refresh exit command and a second self-refresh enter command and performing extra refresh operation in response to the extra refresh command.

Methods may comprise performing normal refresh operation to refresh memory cell rows of the memory device in response to the memory device receiving refresh command, generating a refresh clock signal by a refresh clock signal generator of the memory device, entering a self-refresh mode, in response to the memory device receiving a self-refresh enter command, wherein, when the memory device is in the self-refresh mode, the memory device is responsive to a timing of the refresh clock signal to perform a self-refresh operation to refresh memory cell rows of the memory device, exiting a self-refresh mode in response to the memory device receiving a self-refresh exit command, and determining that no self-refresh operation was performed during the self-refresh mode and generating a flag signal indicating no self-refresh operation was performed during the self-refresh mode.

A flag signal may be provided to a memory controller external to the memory device and the method may comprise receiving, from the memory controller, a refresh command issued in response to the flag signal and performing a refresh operation to refresh the memory cell rows according to the refresh command.

The method may comprise generating the refresh clock signal with a counter that generates a count value that is periodically incremented. When the self-refresh exit command is received, the count value of the counter may be compared with a preset value. When a count value of the refresh clock signal is greater than the preset value, the memory device may initiate (without receipt of a corresponding external refresh command) and perform a self refresh operation to refresh memory cell rows. The self refresh operation may be initiated after and responsive to receipt of the self-refresh exit command.

The refresh clock signal may be free-run and have its cycle reset in response to a normal refresh operation.

The refresh clock signal may have a first self-refresh cycle initiated before the self-refresh period begins and a second self-refresh cycle immediately following the first self-refresh cycle initiated after the self-refresh period ends.

The second self-refresh cycle may be longer than the first self-refresh cycle.

A cycle of the refresh clock signal may be restarted prior to a completion of the cycle of the refresh clock signal. A start time of a self-refresh operation to be performed in response to the self-refresh enter command may be changed in response to the restarting of the cycle of the refresh clock signal.

A normal refresh operation may performed within a standard refresh period of the memory device.

Methods may comprise operating the memory device in a self-refresh mode including during a first self-refresh period, where during the self-refresh mode the memory device may not be accessed by an external device to read or write data, operating the memory device in a normal refresh mode including during a first normal refresh period, where during the normal refresh mode the memory device may receive read and write commands to access memory cells of the memory device, generating a refresh clock with a refresh clock signal generation circuit of the memory device, the refresh clock having a cycle corresponding to a refresh period of the memory device, during the first normal refresh period, in response to receiving an external refresh command, resetting the refresh clock to interrupt a first cycle of the refresh clock and start a second cycle of the refresh clock, prior to completion of the second cycle of the refresh clock, initiating the first self-refresh period in response to receiving a enter self-refresh command; and in response to completion of the second cycle of the refresh clock, performing first a self-refresh operation of memory cell rows of the memory device.

The second cycle may be completed during the first self-refresh period.

No refresh operation of the memory device may be performed between the initiation of the first self-refresh period and the self-refresh operation.

During the first self-refresh period, a third cycle of the refresh clock may be initiated after the second cycle of the refresh clock, and the third cycle of the refresh clock may have a duration greater than a duration of the second cycle.

The third cycle of the refresh clock may be completed in a second normal refresh period in which the memory device operates in the normal refresh mode, the second normal refresh period occurring immediately after the first self-refresh period. The memory device may automatically perform a second self-refresh operation to the memory cell rows in response to completion of the third cycle of the refresh clock.

The end of the first self-refresh period and the beginning of the second normal refresh period may be responsive to receiving a self-refresh exit command causing the memory device to exit a self refresh mode.

The first self-refresh operation may comprise refresh operations for multiple banks of the memory device in response to receiving an all bank refresh command from a memory controller.

The second cycle of the refresh clock may be completed in a second normal refresh period in which the memory device operates in the normal refresh mode, where the second normal refresh period occurs immediately after the first self-refresh period. The memory device may automatically perform a second self-refresh operation to the memory cell rows in response to a timing of the second cycle of the refresh clock.

The memory device may automatically perform the second self-refresh operation to the memory cell rows in response to determining a duration of the second cycle of the refresh clock is greater than a preset duration upon the memory device receiving an exit self-refresh command.

The memory device may issue a flag to an external device in response to determining the duration of the second cycle of the refresh clock is greater than the preset duration upon the memory device receiving the exit self-refresh command.

The memory device may automatically perform the second self-refresh operation to the memory cell rows in response the second cycle of the refresh clock ending.

Memory devices, such as DRAM, memory controllers and memory systems are also contemplated. Methods of operating memory systems (e.g., a memory controller chip in communication with a memory device) and methods of operating a memory controller or other external device interacting with the disclosed memory devices are also contemplated.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
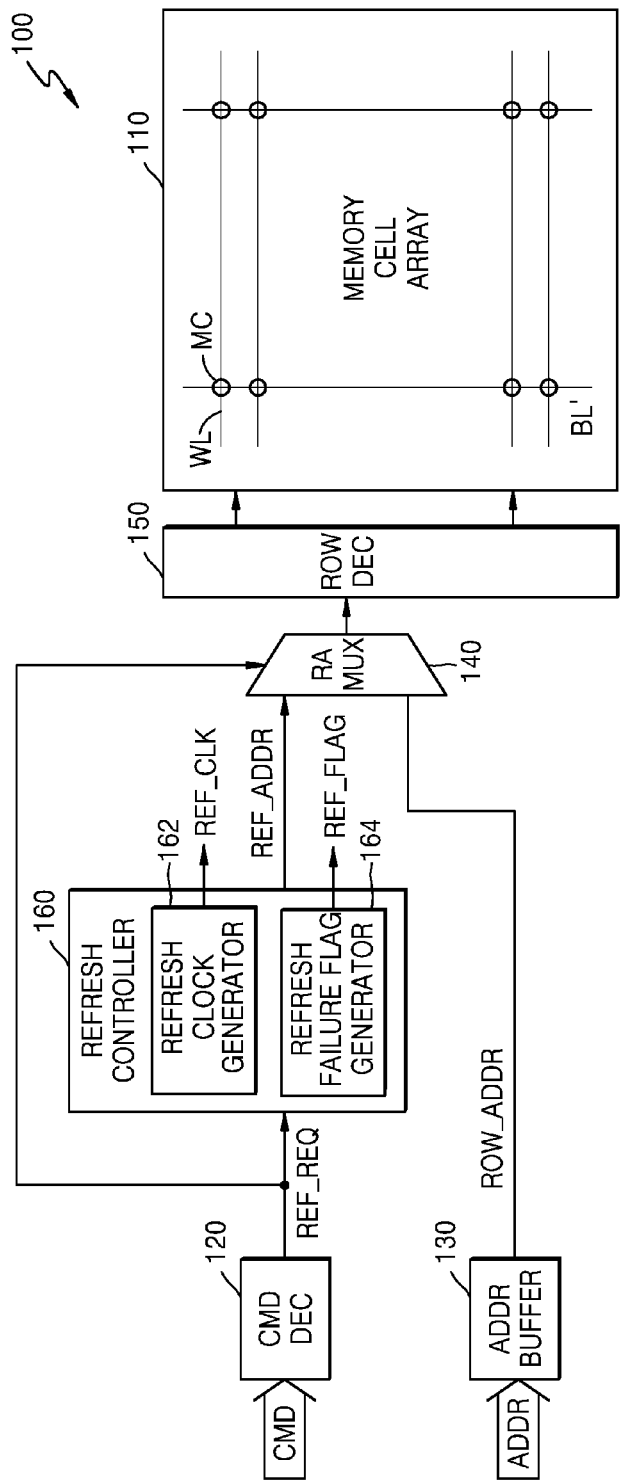
FIG. 1 illustrates a memory device which performs a refresh method according to one or more exemplary embodiments.

In order to provide a sufficient understanding of operational advantages of the inventive concept and objects to be attained by embodiments of the inventive concept, details of the accompanying drawings illustrating exemplary embodiments of the inventive concept will be described, and the inventive concept will be described more fully hereinafter with reference to the accompanying drawings. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. Like reference numerals refer to like elements throughout. Sizes of structures may be greater or less than real structures for clarity of the inventive concept.

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, components, or combinations thereof but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" used herein includes any and all combinations of one or more of the associated listed items.

A semiconductor memory device, for example, dynamic random access memory (DRAM), has finite data retention. As the DRAM continues process scaling, a capacitance value of a cell capacitor may decrease. Accordingly, a bit error rate (BER) may increase, and thus, reliability of data stored in a memory cell may decrease. In order to prevent this, the DRAM performs a refresh operation to maintain the data stored in the memory cell. The DRAM semiconductor memory device is typically embodied in the form of a single semiconductor chip. The embodiments described refer to structure that may be implemented on a single semiconductor chip and a method that may be performed on a single semiconductor chip. However, the embodiments also contemplate that the DRAM semiconductor memory devices and methods described herein may be implemented on more than one chip, such as a with a group of semiconductor memory chips packaged in a single semiconductor package (e.g., where a refresh controller as described herein—either part of one of the memory chips or embodied as a separate controller chip—controls refresh operations of the plural semiconductor chips).

In DRAM, when auto-refresh and self-refresh operations are performed with all-bank refresh (ABR) and a self-refresh enter (SRE) command is frequently issued by a memory controller, refresh operations may be performed more frequently than necessary, and thus refresh operations are greater than necessary for acceptable data retention. Accordingly, refresh power consumption increases, and due to this, performance of the DRAM may be degraded. One or more exemplary embodiments include a method of refreshing a memory device, the method capable of decreasing refresh power consumption.

FIG. 1 illustrates a memory device 100 which performs a refresh method according to one or more exemplary embodiments.

Referring to FIG. 1, the memory device 100 may be a storage device including a semiconductor device. For example, the memory device 100 may be DRAM, such as synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, or DDR4 SDRAM. The memory device 100 may be a memory other than DRAM that includes memory that periodically requires a refresh operation to properly retain stored data.

The memory device 100 may include a memory cell array 110, a command decoder 120, an address buffer 130, a row address multiplexer 140, a row decoder 150, and a refresh controller 160.

The memory cell array 110 includes a plurality of memory cells MC provided in a matrix form with rows and columns. The memory cell array 110 may include a plurality of wordlines WL and a plurality of bitlines BL connected to the memory cells MC. The wordlines WL may be connected to respective rows of the memory cells MC, and the bitlines BL may be connected to respective columns of the memory cells MC. A row of memory cells MC that are connected to one wordline WL may be referred to as a memory cell row.

The command decoder 120 may receive a command CMD from an external device, for example, a memory controller, and may decode the command CMD. The command CMD may be received as a plurality of signals received in parallel, such as a writing enable signal (/WE), a row address strobe signal (/RAS), a column address strobe signal (/CAS), and a chip selection signal (/CS). The command decoder 120 may decode the command CMD to generate internal control signals corresponding to the command CMD.

In response to receiving and decoding an external refresh command, the command decoder 120 may generate a refresh request signal REF_REQ for requesting the refresh controller 160 to refresh one or more memory cell rows. Normal refresh operations referred to herein refer to refresh operations responsive to an externally received refresh commands. Normal refresh operations may be responsive to externally received refresh commands sent with a row addresses identifying one or more memory cell row addresses to be refreshed. Normal refresh operations, such as auto-refresh operations, may be responsive to externally received refresh commands sent without row addresses and instead instruct the memory device to generate one or more row addresses of the memory cell rows to be refreshed. Normal refresh operations will be described herein with respect to auto-refresh operations. In response to receiving and decoding an external auto-refresh command, the command decoder 120 may generate a refresh request signal REF_REQ to request the refresh controller 160 generate a refresh row address REF_ADDR for refreshing. Normal refresh (e.g., auto-refresh) for refreshing data of the memory cells MC connected to the memory cell row in the memory cell array 110 may be performed in response to the refresh request signal REF_REQ.

In response to an SRE command, the command decoder 120 may allow the refresh controller 160 to generate a refresh clock signal REF_CLK, and perform self-refresh operations for refreshing, according to the refresh clock signal REF_CLK, data of the memory cells MC connected to the memory cell row in the memory cell array 110.

The address buffer 130 may receive an address ADDR including a row address and a column address from the memory controller. The address buffer 130 may provide a received row address ROW_ADDR to the row address multiplexer 140 and may provide a received column address to a column decoder. The column decoder may activate a sense amplifier corresponding to the column address. Data read from the memory cell array 110 may be sense-amplified by the sense amplifier and provided to the memory controller via a data input/output buffer.

The row address multiplexer 140 may receive the row address ROW_ADDR from the address buffer 130 and may receive the refresh row address REF_ADDR from the refresh controller 160. The row address multiplexer 140 may select and output the refresh row address REF_ADDR in response to the refresh request signal REF_REQ. In other examples, the row address multiplexer 140 may receive a selection signal generated by refresh controller 160 to which the row address multiplexer 140 is responsive to select the refresh row address REF_ADDR or an externally received row address ROW_ADDR from address buffer 130. A row address output from the row address multiplexer 140 may be provided to the row decoder 150.

The row decoder 150 may decode the row address output from the row address multiplexer 140 and activate the memory cell row that corresponds to the row address (e.g., applying a driving voltage to the word line of the memory cell row). The row decoder 150 may decode the row address ROW_ADDR in order to perform a reading or writing operation, and selectively activate the memory cell row, thereby performing the reading or writing operation. The row decoder 150 may decode the refresh row address REF_ADDR to activate the memory cell row corresponding to the refresh row address REF_ADDR in order to perform a refresh operation of this memory cell row.

The refresh controller 160 includes a refresh clock generator 162 and a refresh failure flag generator 164. The refresh clock generator 162 may generate the refresh clock signal REF_CLK and may free-run so that self-refresh operations may be performed according to the refresh clock signal REF_CLK. The self-refresh operations may be initiated at a timing responsive to the refresh clock signal REF_CLK. The refresh clock signal REF_CLK may provide information indicative of a refresh period in which memory cell rows should be refreshed (e.g., at least one time). The refresh clock REF_CLK may provide information indicating the expiration of a refresh period in order to initiate subsequent self-refresh operations. The refresh clock signal REF_CLK may be free-run and be reset in response to refresh operations. For example, the refresh clock signal REF_CLK may be reset upon performing an all bank refresh responsive to a normal refresh operation.

The refresh clock generator 162 may change a cycle of the refresh clock signal REF_CLK so that a start time of self-refresh operations to be performed in response to the SRE (self refresh enter) command may be delayed after entering self-refresh mode (in response to the SRE command) and need not be performed immediately after entering the self-refresh mode. The refresh clock generator 162 may provide the refresh clock signal REF_CLK so that, when the SRE command is received, refresh operations after the self-refresh begins may be performed within a self-refresh period when the memory device has been put into a self refresh mode. The refresh clock generator 162 may initiate a first cycle of the refresh clock signal REF_CLK before the memory device enters self-refresh mode and initiate a second cycle of the refresh clock signal REF_CLK after the memory device enters self-refresh mode.

It will be appreciated that the self refresh periods and normal refresh periods described and illustrated herein do not necessarily correspond to and should not be defined by when normal refresh and self refresh operations actually occur. For example, the self refresh period of the DRAM may be a period when the memory device operates in a self refresh mode (e.g., between a time of entering a self refresh mode in response to receipt of self refresh enter command SRE and a time of exiting the self refresh mode in response to receipt of a self refresh exit command SRX). During the self refresh mode, contents of the memory array of the DRAM may not be accessed (e.g., read or written to) by the memory controller or other external device until the DRAM exits the self refresh mode. During the self refresh mode, the DRAM may operate in a power saving mode, such as by turning off a phase locked loop circuit, turning off a delayed locked loop circuit, and switching on-die-termination connections to the external signal terminals of the DRAM to a high impedance state. In some examples, the self refresh mode may be the same as a sleep mode of the DRAM. However, as described below with respect to FIGS. 9-11, in certain circumstances when the self refresh period is short, the DRAM may not need to perform a self refresh operation and thus may avoid performing any self refresh operation during the self refresh period. The normal refresh periods may be periods between the self refresh modes where the contents of the memory array of the DRAM may be accessed. However, as described below, in some examples, it may be advantageous that the DRAM perform a self refresh operation (e.g., without an instruction from the DRAM) in a normal refresh period. It will be appreciated that a normal refresh mode of operation of a DRAM (e.g., during the normal refresh period) might allow several modes of operation all of which should be considered part of the normal refresh mode described herein.

The refresh failure flag generator 164 may generate a refresh failure flag REF_FLAG when no self-refresh operation is performed during a self refresh period. The refresh failure flag REF_FLAG may be provided to a controller to cause refresh processing operations to be performed by the controller, and/or to cause refresh processing operations to be performed in the memory device 100.

Figure 2:
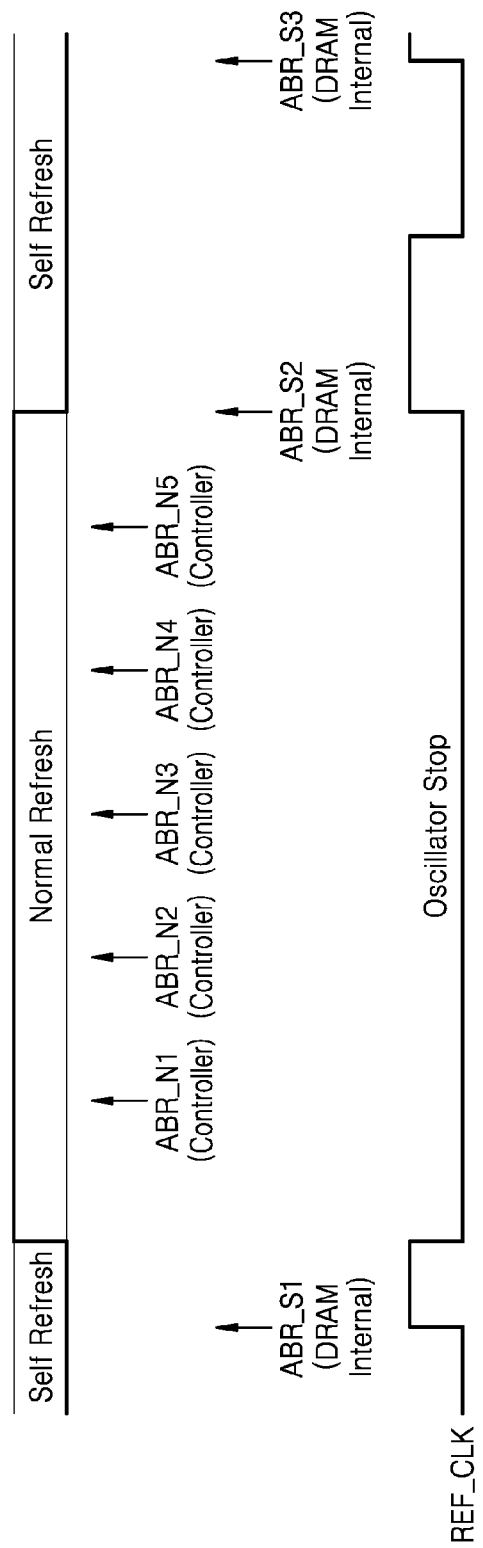
FIGS. 2 to 4 illustrate excessive refresh operations of a memory device.
Figure 3:
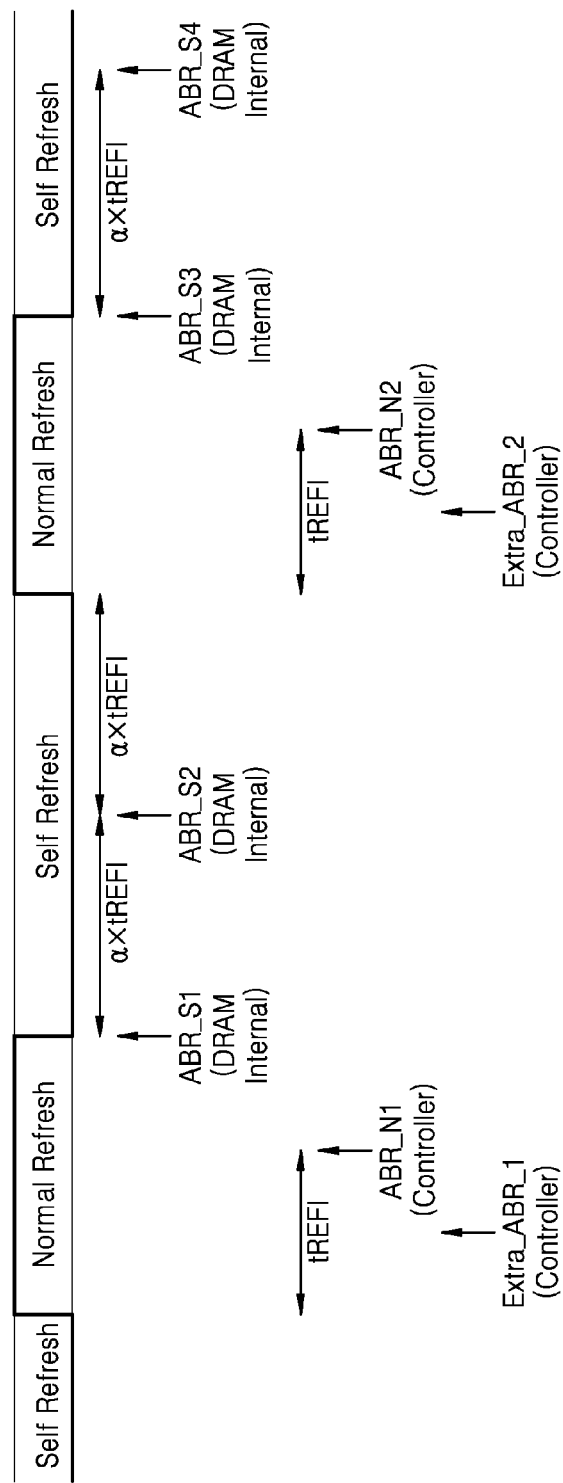
Figure 4:
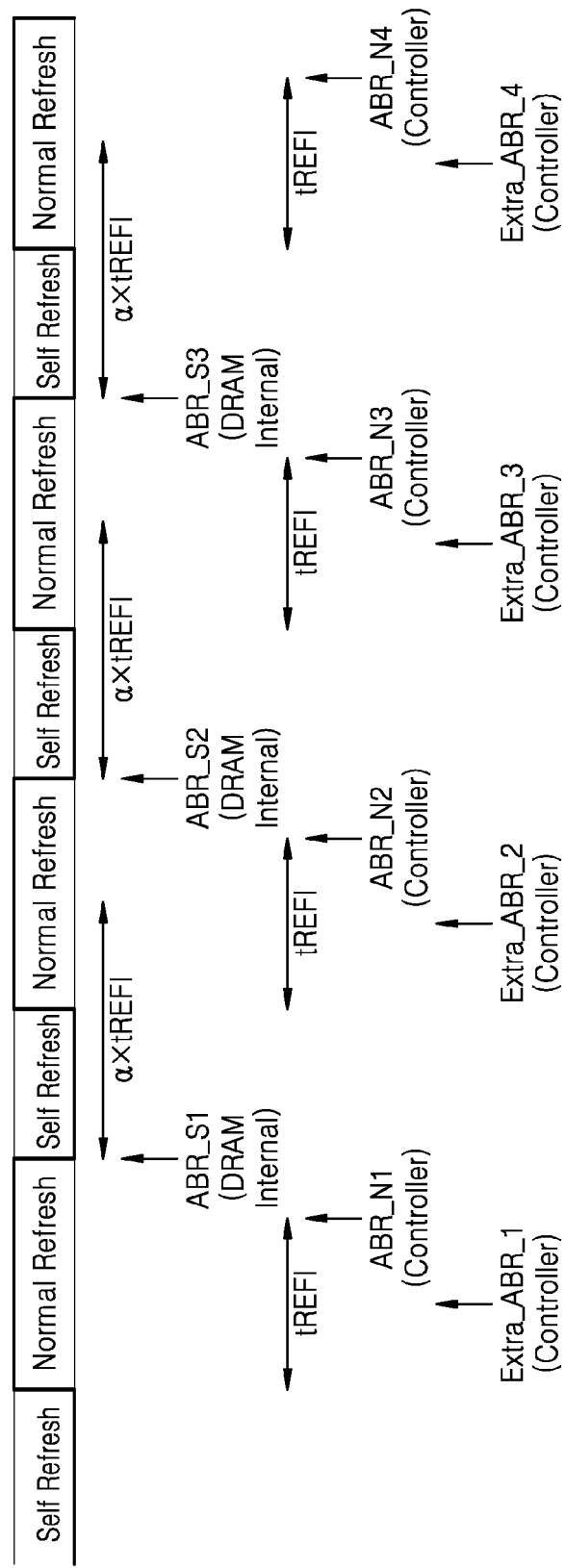

FIGS. 2 to 4 illustrate comparative examples with respect to excessive refresh operations of a memory device.

Referring to FIG. 2, a refresh operation of the DRAM may be divided into self-refresh and auto-refresh. Auto-refresh may be a type of normal refresh that is performed in response to and at a timing responsive to receipt of an external refresh command of a memory controller (hereinafter referred to as 'a controller'). Both self-refresh and normal refresh may be performed as an all bank refresh ("ABR") in which all banks of the DRAM are refreshed. An ABR operation may, for each bank of the DRAM, sequentially activate each memory cell row (and cause the contents of the corresponding memory cells to be sensed by sense amplifiers to refresh the memory cells). The ABR operation may continuously (e.g., without interruption) perform refresh operations of the memory cell rows of all the banks of the memory device until each memory cell row has been refreshed. After initiation of the ABR operation, the memory device may not be available to provide an external source (e.g., the memory controller) access (e.g., read and write operations) to the memory cells until completion of the ABR operation.

ABR operations ABR_N1 to ABR_N5 initiated by the controller are performed as normal refresh auto-refresh operations, and ABR operations ABR_S1 to ABR_S3 are performed by the DRAM internally during a self-refresh mode. The DRAM may initiate the ABR operations ABR_N1 to ABR_N5 in responsive to timing determined by the controller and initiate the ABR operations ABR_S1 and ABR_S2 in response to an internally generated refresh clock signal REF_CLK.

Only the ABR operations ABR_S1 and ABR_S2 in the DRAM, are performed according to the refresh clock signal REF_CLK. During normal refresh, the refresh clock signal REF_CLK is not used and an oscillator operation of the refresh clock generator 162 for generating the refresh clock signal REF_CLK may be stopped.

As shown in FIG. 2, ABR operations ABR_N1 to ABR_N5 are initiated by the controller so that a refresh cycle is performed on a regular basis, generally, every normal refresh period tREFI. Referring to FIG. 3, ABR operations ABR_N1 and ABR_N2 are initiated by the controller during a normal refresh operation so that refresh cycles are completed within a predetermined normal refresh period tREFI. The normal refresh period tREFI indicates a refresh period (typically defined by a standard of a memory device) that is set to refresh memory cell rows for 32 ms, 64 ms, or the like. In some DRAM devices, all memory cell rows (or all memory cell rows storing data) are refreshed every normal refresh period tREFI by the controller as part of normal refresh operations. In other DRAM devices, most of the memory cell rows ("normal cell rows") will be refreshed every normal refresh period tREFI, while other cell rows ("weak cell rows") may be refreshed more often than once (e.g. twice) every refresh period tREFI. Some DRAM devices also allow other cell rows ("strong cell rows") to be refreshed less than once per refresh period tREFI (e.g., once every two refresh periods tREFI). Weak cell rows and/or strong cell rows may be identified by testing (e.g., as part of manufacturing) and have corresponding information programmed into the DRAM device (e.g., by programming address information into fuse arrays) so that they may be refreshed at a different refresh rate than the normal cell rows. The description of the embodiments herein relates to refresh operations for normal cell rows but it will be recognized that embodiments may also provide different refresh rates for other cell rows (e.g., weak cell rows and/or strong cell rows) in the conventional manner.

As shown in FIG. 3, ABR operations ABR_S1 to ABR_S4 performed in the DRAM during a self-refresh mode are performed within a self-refresh period α*tREFI longer than the normal refresh period tREFI. Conventionally, at least one extra refresh command is required between a self-refresh exit (SRX) command and the SRE command. After the DRAM SRX command, the controller must issue refresh command(s) to refresh all banks of the DRAM before the SRE command can be issued again. To assure that the memory cells do not go without a refresh operation longer than the required self refresh period, upon exiting self-refresh mode and entering normal refresh mode (or normal operation), one additional ABR operation is performed by the DRAM device upon expiration of the self-refresh period α*tREFI (that started during self refresh mode but ends in the normal refresh mode) while the controller is required to initiate an ABR operation (or equivalent) of the DRAM after expiration of the normal refresh period tREFI. In addition, the DRAM conventionally initiates a minimum of one ABR once it enters self refresh mode. As shown in FIG. 3, after performing ABR in a self-refresh mode, the DRAM is further required to perform extra ABR operations Extra_ABR_1 and Extra_ABR_2 by the controller in the normal refresh mode.

When self-refresh is frequently performed, as illustrated in FIG. 4, extra ABR operations Extra_ABR_1 to Extra_ABR_4 may be performed in the normal refresh mode. In this case, the DRAM comes to perform the ABR operations ABR_S1 to ABR_S3 in the DRAM, in the self-refresh mode, and during the normal refresh mode, the extra ABR operations Extra_ABR_1 to Extra_ABR_4 and the ABR operations ABR_N1 to ABR_N5 initiated by the controller. Due to this, the DRAM may perform the refresh operation more frequently than is necessary for data retention, and thus, refresh power consumption may be increased.

Figure 5:
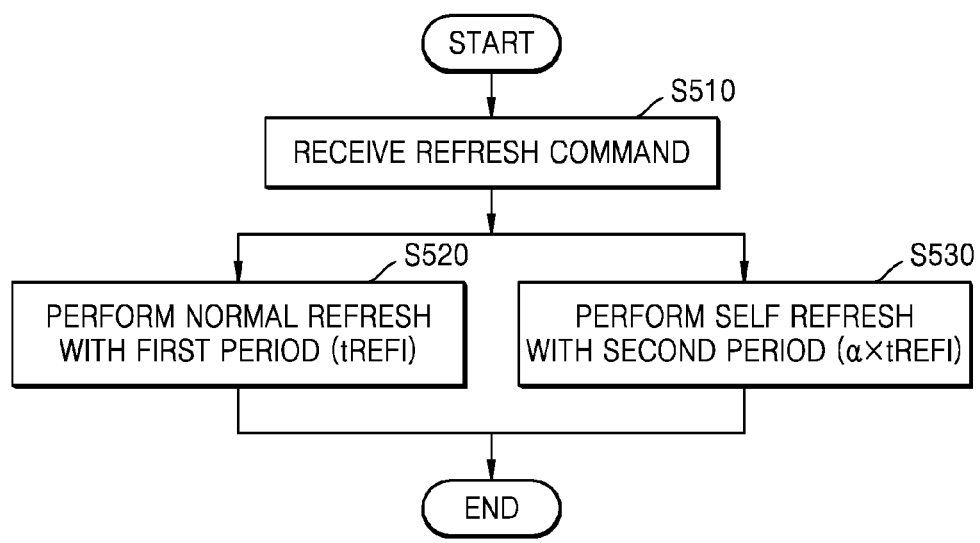
FIG. 5 is a flowchart of a refresh method of a memory device, according to one or more exemplary embodiments.

FIG. 5 is a flowchart of a refresh method of a memory device, according to one or more exemplary embodiments.

Referring to FIG. 5, in operation S510, the memory device, for example, the DRAM, receives a refresh command from a memory controller. The refresh command may include a refresh command for instructing auto-refresh, and SRE and SRX commands for instructing the DRAM to respectively enter and exit self-refresh mode.

In operation S520, the DRAM performs normal refresh according to the refresh command. Normal refresh is set to be performed with the normal refresh period tREFI. The normal refresh period tREFI may be a refresh period defined by the DRAM standard, for example, 8K times/32 ms, 8K times/64 ms, or the like. The normal refresh period tREFI may be monitored by the memory controller, such as by running a clock of the memory controller. The memory controller may cause an appropriate refresh cycle to be performed (e.g., an ABR operation or equivalent) on the DRAM every normal refresh period tREFI so that memory cell rows are not left unrefreshed for a period longer than the normal refresh period tREFI.

In operation S530, the DRAM performs self-refresh according to the SRE and SRX commands. Self-refresh is set to be performed with the self-refresh period α*tREFI longer than the normal refresh period tREFI.

For this refresh operation, the free-running refresh clock signal REF_CLK may be generated so that self-refresh operations may be performed in response to the refresh clock signal REF_CLK. The refresh clock signal may periodically provide information that a refresh period has elapsed. For example, the refresh clock signal may comprise a plurality of cycles, each cycle have a period corresponding to a refresh period such that the refresh clock transitioning to a new cycle/period may indicate that a refresh period has elapsed. The refresh clock signal REF_CLK may be reset in response to a normal refresh operation. For example, the refresh clock signal REF_CLK may be reset in response to an externally received ABR command issued from a memory controller during the normal refresh mode of the DRAM (or normal operation when the memory controller may perform access operations (e.g., read and write operations) to the memory cells of the DRAM). Upon resetting of the refresh clock signal, the refresh clock may interrupt the current cycle and initiate a new cycle. A cycle of the refresh clock signal REF_CLK may initiate a start time of self-refresh operations to be performed (e.g., ABR operation). A cycle of the refresh clock signal REF_CLK initiated prior to receiving an SRE command (received during a normal refresh mode) may initiate a start time of self-refresh operations to be performed (e.g., ABR operation) during a self refresh mode (e.g., that the DRAM subsequently entered after receiving the SRE command). A cycle of the refresh clock signal REF_CLK may be changed so that, when the SRE command is received, first refresh after entering self-refresh may be performed upon expiration of a cycle of the refresh clock signal REF_CLK having a period longer than the normal refresh period tREFI, such as a self-refresh period self-refresh period α*tREFI. In addition, a first cycle of the refresh clock signal REF_CLK initiated before entering self-refresh mode and a second cycle of the refresh clock signal REF_CLK initiated after self-refresh mode may be set to be different from each other.

Figure 6:
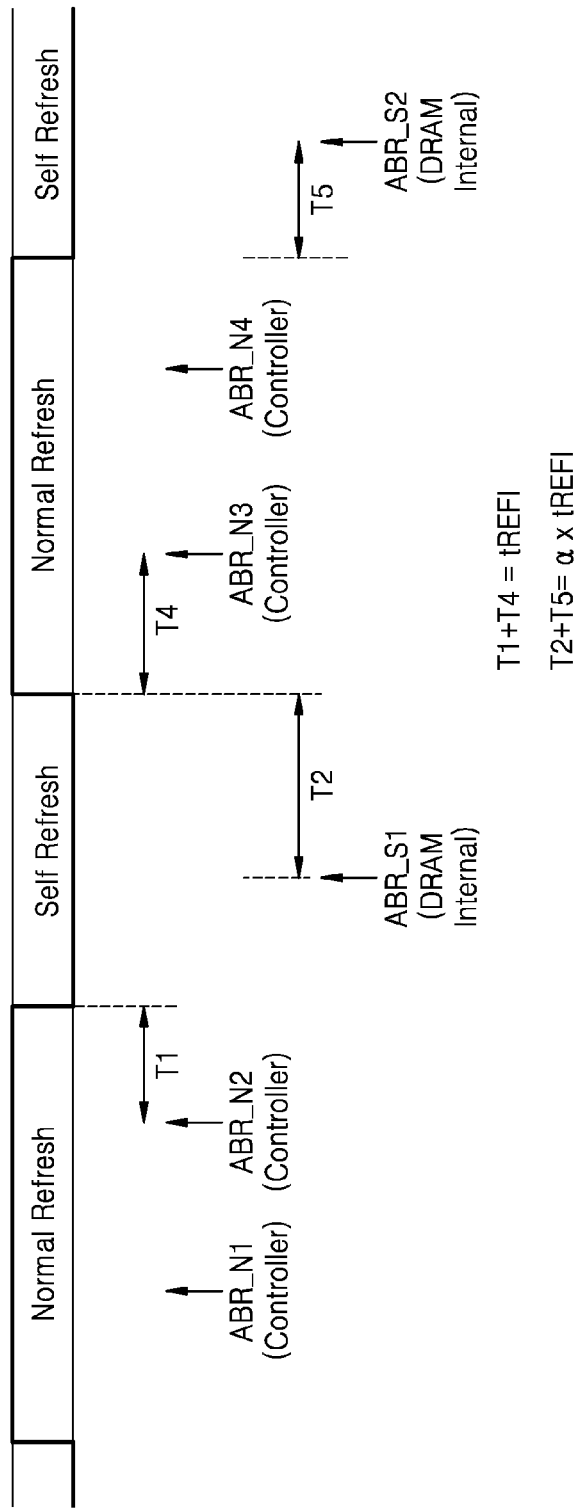
FIG. 6 is a timing diagram for describing refresh operations performed according to the refresh method of FIG. 5.

FIG. 6 is a timing diagram for describing refresh operations which are performed according to the refresh method of FIG. 5.

Referring to FIG. 6, ABR operations ABR_N1 to ABR_N4 by the controller, which are according to normal refresh, may be performed. From among the ABR operations ABR_N1 to ABR_N4 by the controller, operations ABR_N1 and ABR_N2 may be performed by identical normal refresh operations, operations ABR_N2 and ABR_N3 may be performed by normal refresh operations different from each other, and operations ABR_N3 and ABR_N4 may be performed by identical normal refresh operations.

The operation ABR_N2 by the controller may perform distributed refresh and may be performed with an interval T1+T4. The interval T1+T4, which is the normal refresh period tREFI, may correspond to a refresh period defined by the DRAM standard.

The ABR operations ABR_S1 and ABR_S2 in the DRAM, which are according to self-refresh, may be performed. The operation ABR_S1 which may perform distributed self refresh in the DRAM may be performed with an interval T2+T5. The interval T2+T5, which is the self-refresh period $\alpha$*tREFI, is set to be longer than the normal refresh period tREFI.

Figure 7:
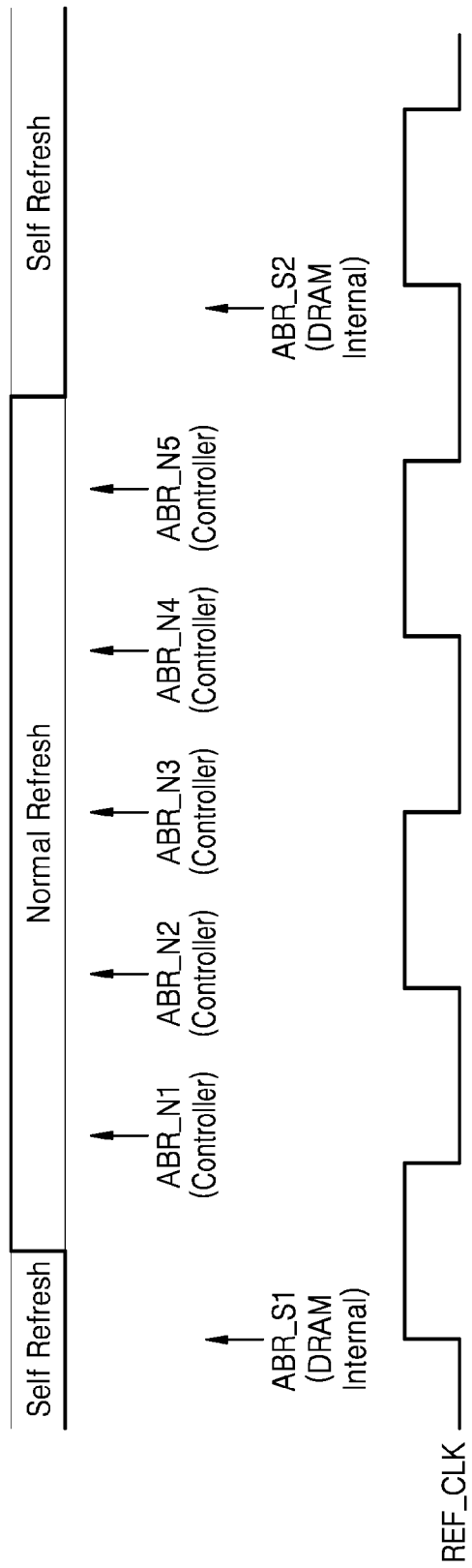
FIGS. 7 and 8 illustrate a refresh clock generator in a refresh controller of FIG. 1.
Figure 8:
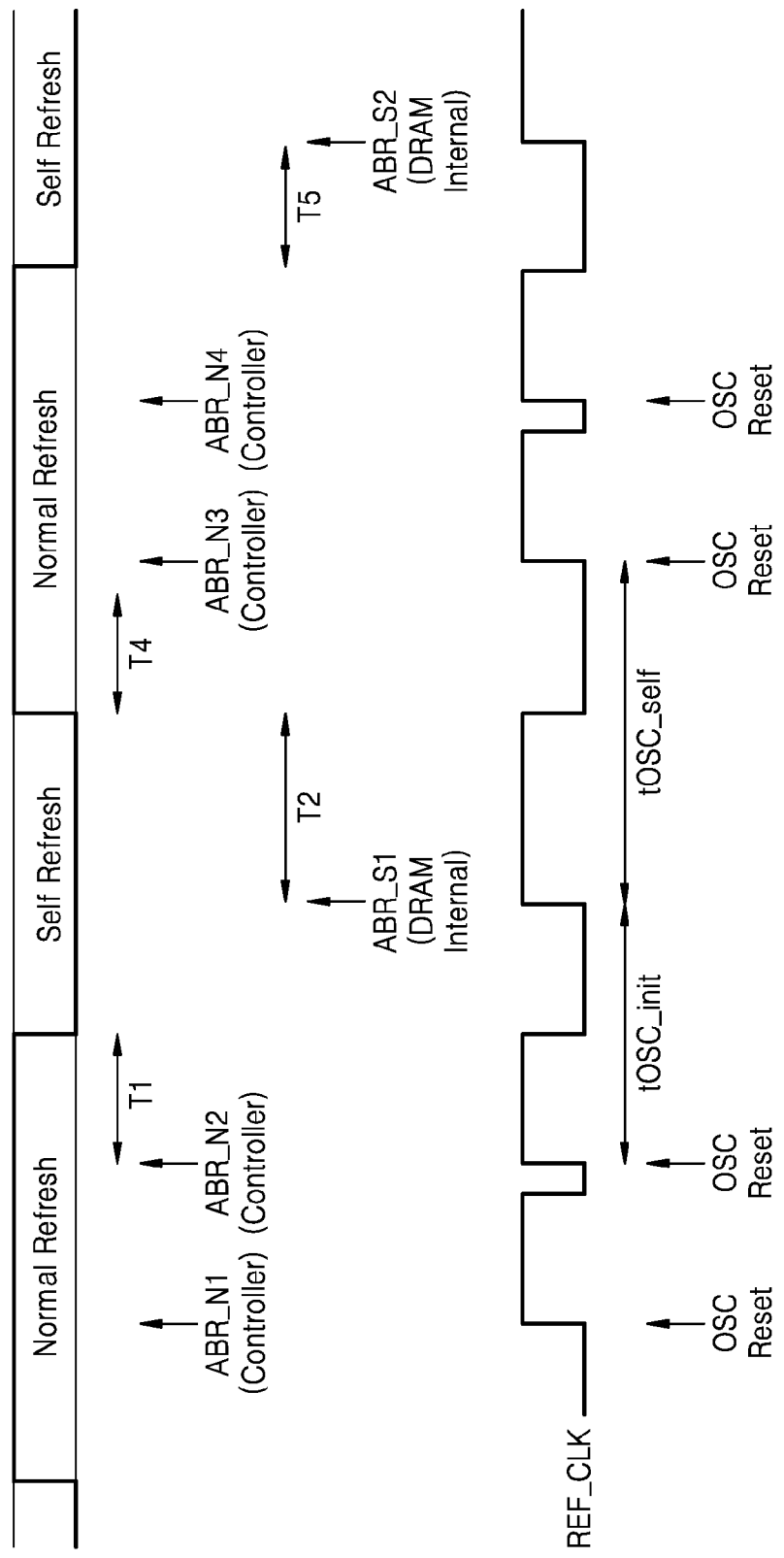

FIGS. 7 and 8 illustrate the refresh clock generator 162 in the refresh controller 160 of FIG. 1.

Referring to FIG. 7, the refresh clock generator 162 (refer to FIG. 1) may generate the free-running refresh clock signal REF_CLK during not only self-refresh but also normal refresh. According to a rising edge of the refresh clock signal REF_CLK, the ABR operations ABR_S1 and ABR_S2 in the DRAM, which are according to self-refresh, may be performed. The ABR operations ABR_N1 to ABR_N5 by the controller, which are according to normal refresh, are not performed according to the refresh clock signal REF_CLK.

Referring to FIG. 8, the ABR operations ABR_S1 and ABR_S2 in the DRAM, which are according to self-refresh, may be performed according to a rising edge of the refresh clock signal REF_CLK.

An oscillator in the refresh clock generator 162 (refer to FIG. 1) may be reset whenever each of the ABR operations ABR_N1 to ABR_N4 by the controller is performed. Since the ABR operations ABR_N1 to ABR_N4 by the controller are set to be performed with the normal refresh period tREFI, the ABR_N2 and ABR_N3 operations by the controller may be performed with the interval T1+T4 corresponding to the normal refresh period tREFI.

The ABR operations ABR_S1 and ABR_S2 in the DRAM, which are according to self-refresh, are set to be performed with the self-refresh period $\alpha$*tREFI, and accordingly, may be performed with the interval T2+T5 corresponding to the self-refresh period $\alpha$*tREFI.

In order for the ABR operations ABR_S1 and ABR_S2 in the DRAM, which are according to self-refresh, to be performed with the self-refresh period $\alpha$*tREFI while compared with the ABR operations ABR_N1 to ABR_N4 by the controller, which are performed with the normal refresh period tREFI, a cycle of the refresh clock signal REF_CLK may be changed.

A first self-refresh cycle tOSC_init of the refresh clock signal REF_CLK between operation ABR_N2 by the controller and operation ABR_S1 which is performed in the DRAM and a second self-refresh cycle tOSC_self of the refresh clock signal REF_CLK between the operation ABR_S1 which is performed in the DRAM and operation ABR_N3 by the controller may be changed. The first self-refresh cycle tOSC_init may be shorter than the second self-refresh cycle tOSC_self.

As described above, the refresh clock signal REF_CLK may be controlled, and thus, the self-refresh may be prevented from being performed according to the SRE command, thereby decreasing an increase in refresh power.

Figure 9:
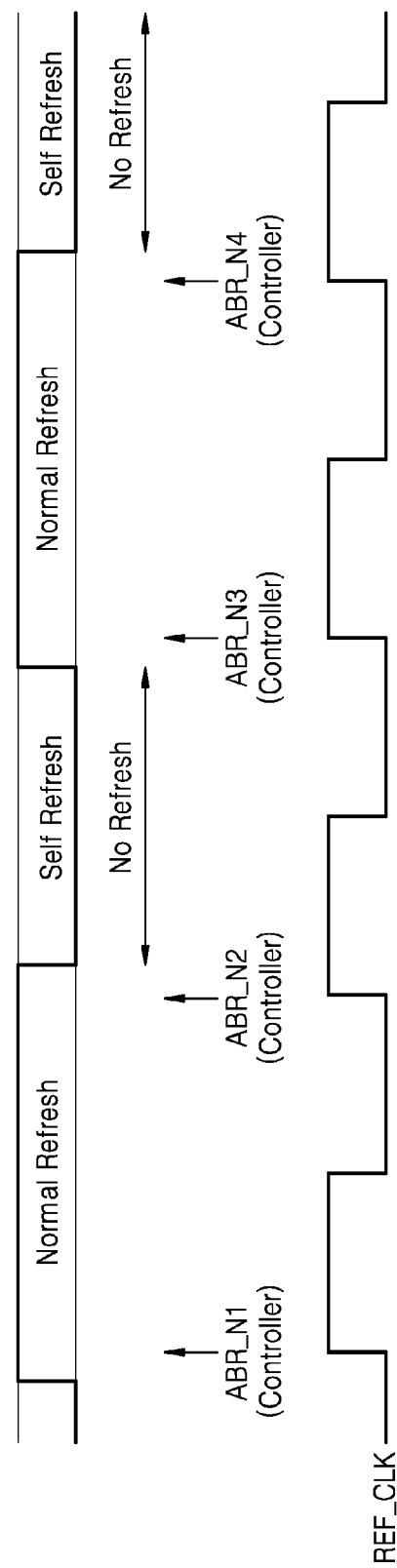
FIGS. 9 to 11 illustrate a method of processing no self-refresh, according to one or more exemplary embodiments.
Figure 10:
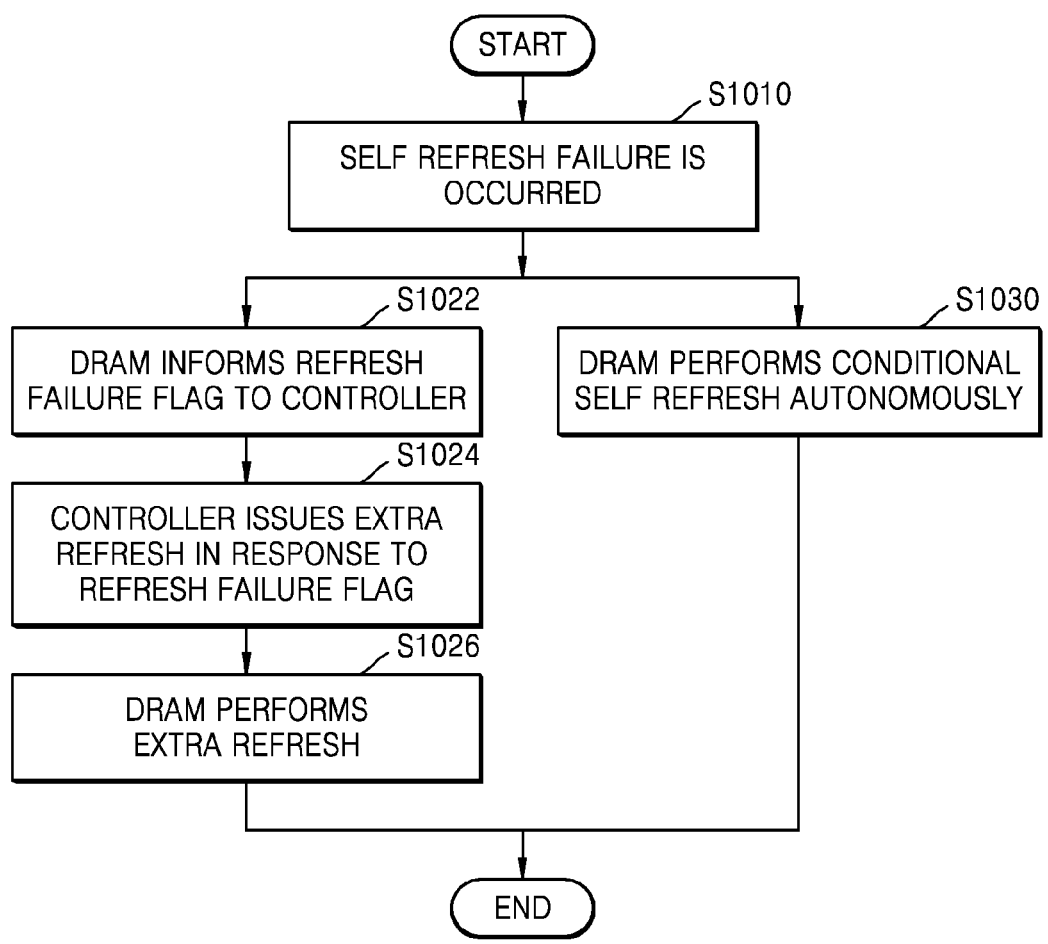
Figure 11:
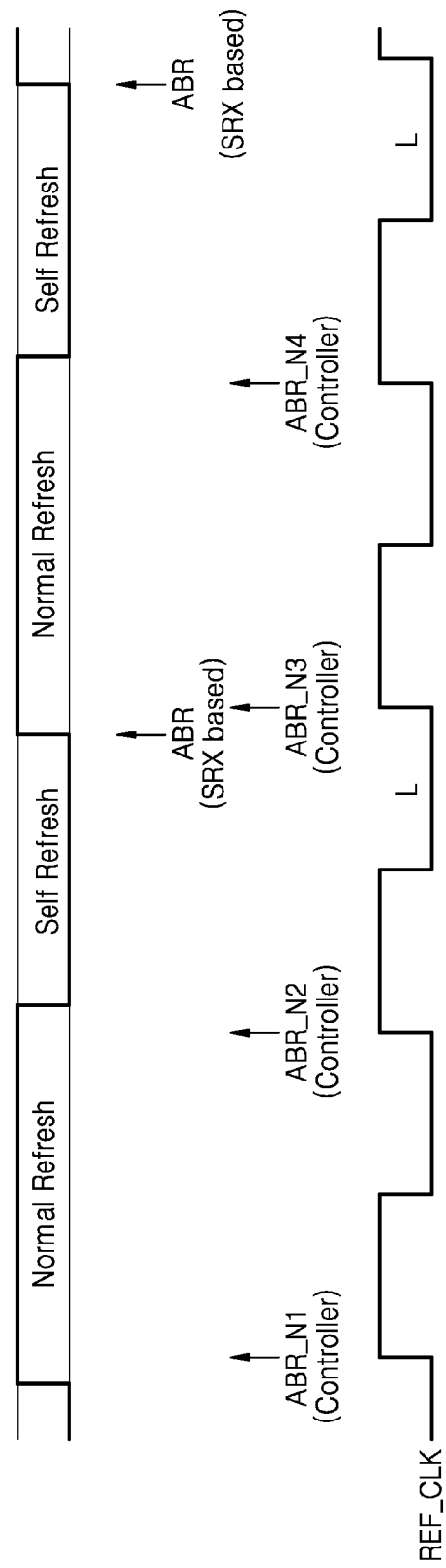

FIGS. 9 to 11 illustrate a method of processing self-refresh failure, according to one or more exemplary embodiments. FIGS. 9 and 11 are timing diagrams in which no self-refresh operation is performed in a self refresh period, and FIG. 10 is a flowchart of a process relating to self-refresh failure.

Referring to FIG. 9, in the DRAM device (e.g. as described in the examples herein), a self refresh ABR operation may be triggered according to a rising edge of the refresh clock signal REF_CLK. However, when a self refresh period is exited (e.g., via receipt of the self refresh exit command SRX), the rising edge of the refresh clock signal REF_CLK may not occur during a self-refresh period, and thus no self-refresh operation may be performed in the self refresh period.

Referring to FIG. 10, in operation S1010, when no self-refresh operation is performed during a self refresh period in the DRAM 100 (refer to FIG. 1), refresh processing operations S1022 to S1024 may be performed by the controller and refresh processing operations S1026 and S1030 may be performed by the DRAM 100.

When no self-refresh is performed by the DRAM in a self refresh period in the DRAM 100 (refer to FIG. 1), the refresh failure flag generator 164 of the refresh controller 160 (refer to FIG. 1) generates the refresh failure flag REF_FLAG indicating a refresh failure (S1010). In response to operation S1022, the DRAM 100 may communicate the refresh failure flag REF_FLAG generation to the controller (e.g., transmitting the refresh failure flag REF_FLAG via signal line or transmitting a code indicating generation of the refresh failure flag REF_FLAG). The controller may receive the refresh failure flag REF_FLAG of the DRAM 100, and in response thereto, in operation S1024, the controller may issue an ABR refresh command. In operation S1026, the DRAM 100 may receive the ABR refresh command from the controller and may perform an ABR refresh in response thereto.

When no self-refresh occurs in the DRAM 100 (refer to FIG. 1) in operation S1010, the DRAM 100 may autonomously perform (without receiving an associated refresh command from the controller) a self-refresh operation conditioned on the refresh state of the refresh clock generator 162 in operation S1030. The conditional self-refresh operation, as illustrated in FIG. 11, may autonomously perform a self refresh ABR_SRX operation when the current cycle of the refresh clock signal REF_CLK is within a predetermined duration to being completed. For example, at the time of receiving the SRX command, a count value of a counter of the refresh clock generator 162 (e.g., as described herein) may be compared (e.g., with a known comparator circuit) to a preset count value to determine if the count value is greater than or equal to the preset count value, and if so, perform a self refresh ABR_SRX operation. If the count value is less than the fixed count value, the DRAM may exit self refresh mode without performing a self refresh operation.

Figure 12:
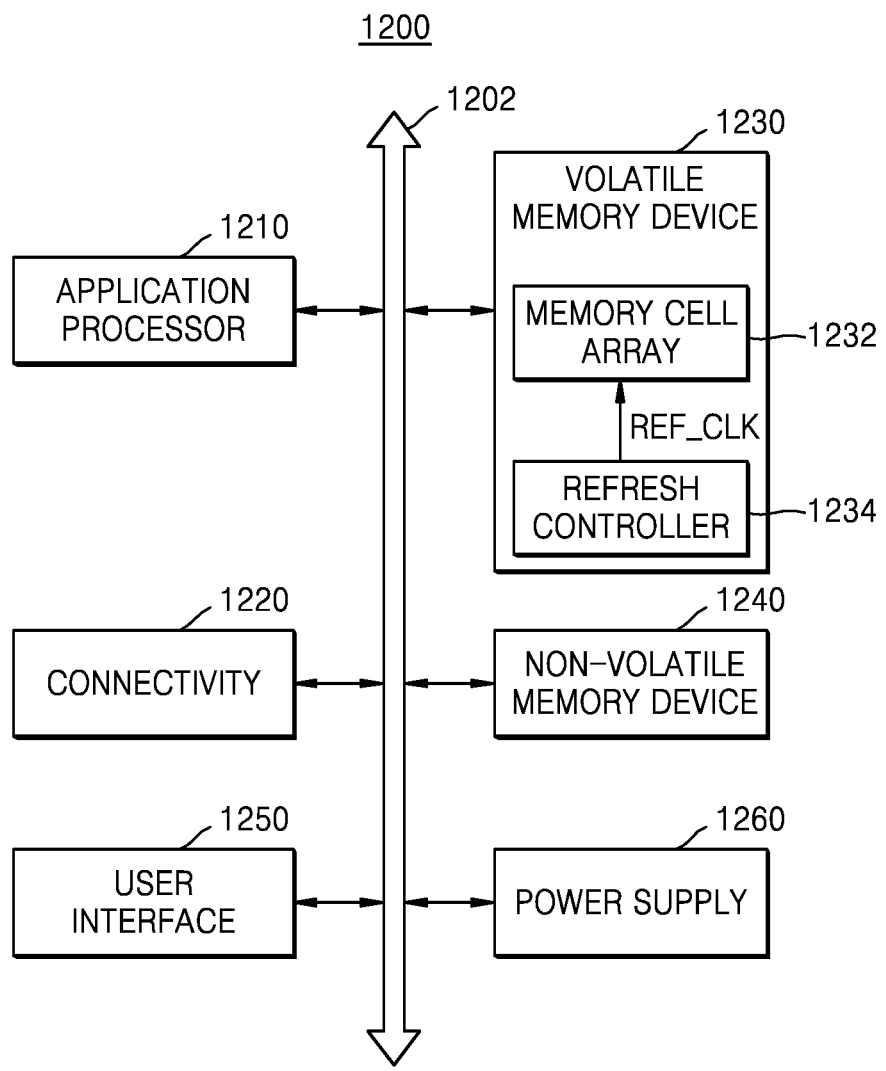
FIG. 12 is a block diagram of a mobile system comprising a memory device including a refresh controller performing a refresh method according to one or more exemplary embodiments.

FIG. 12 is a block diagram of a mobile system 1200 to which a memory device including a refresh controller performing a refresh method according to one or more exemplary embodiments is applied.

Referring to FIG. 12, the mobile system 1200 may include an application processor 1210, a connectivity unit 1220, a first memory device 1230, a second memory device 1240, a user interface 1250, and a power supply 1260, which are connected to each other via a bus 1202. The first memory device 1230 may be a volatile memory device, and the second memory device 1240 may be a non-volatile memory device. In some embodiments, the mobile system 1200 may be an arbitrary mobile system, such as a mobile phone, a smartphone, a personal digital assistant (PDA), a portable multimedia player (PMP), a digital camera, a music player, a portable game console, or a navigation system.

The application processor 1210 may execute applications that provide Internet browsers, games, moving pictures, etc. In some embodiments, the application processor 1210 may include one processor core (single core) or a plurality of processor cores (multi-core). For example, the application processor 1210 may include a dual-core, a quad-core, or a hexa-core. Also, in some embodiments, the application processor 1210 may further include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, or universal serial bus (USB) communication. For example, the connectivity unit 1220 may include a baseband chipset and may support communication such as GSM, GRPS, WCDMA, or HSxPA.

The first memory device 1230, which is a volatile memory device, may store data processed by the application processor 1210 as entry data or may operate as a working memory. The first memory device 1230 includes a refresh controller 1234 for refreshing memory cells of a memory cell array 1232. The refresh controller 1234 may generate the free-running refresh clock signal REF_CLK so that self-refresh may be performed. The refresh controller 1234 may change a cycle of the refresh clock signal REF_CLK so that a start time of self-refresh to be performed in response to the SRE command may be changed, may change a cycle of the refresh clock signal REF_CLK so that self-refresh may not be performed when the SRE command is received, and may set a first refresh cycle of the refresh clock signal REF_CLK before self-refresh and a second refresh cycle of the refresh clock signal REF_CLK after self-refresh to be different from each other. The refresh controller 1234 may allow extra refresh by a memory controller or extra refresh by the memory device itself to be performed in response to no self-refresh.

The second memory device 1240, which is a non-volatile memory device, may store a boot image for booting the mobile system 1200. For example, the second memory device 1240 may be provided as electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), or the like.

The user interface 1250 may include at least one input device, such as a keypad or a touch screen, and/or at least one output device, such as a speaker or a display device. The power supply 1260 may supply an operating voltage of the mobile system 1200. Also, in some embodiments, the mobile system 1200 may further include a camera image processor (CIP), and a storage device, such as a memory card, a solid state drive (SSD), a hard disk drive (HDD), or a compact disc read-only memory (CD-ROM).

Figure 13:
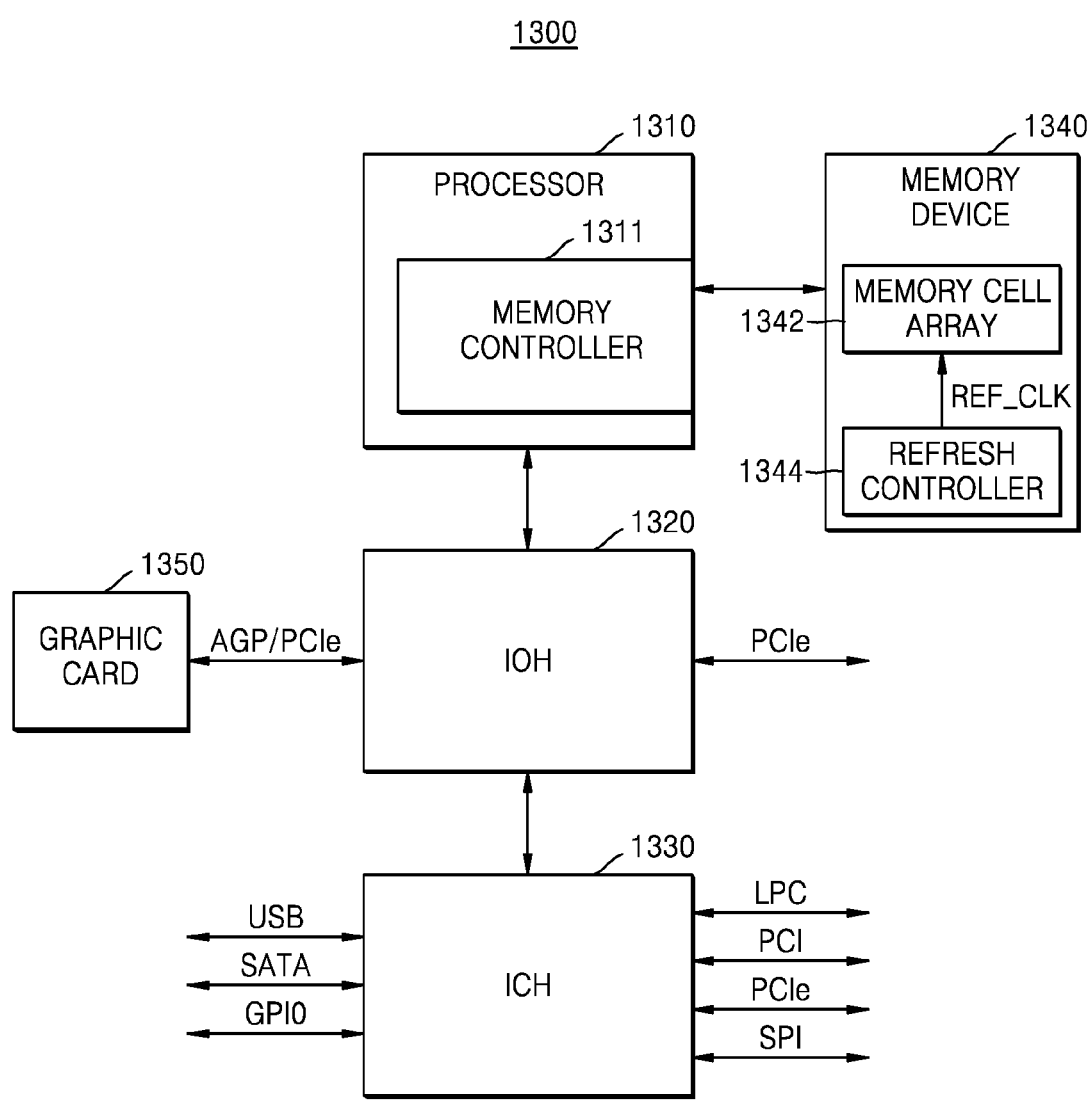
FIG. 13 is a block diagram of a computing system comprising a memory device including a refresh controller performing a refresh method according to one or more exemplary embodiments.

FIG. 13 is a block diagram of a computing system 1300 to which a memory device including a refresh controller performing a refresh method according to one or more exemplary embodiments is applied.

Referring to FIG. 13, the computer system 1300 includes a processor 1310, an input/output (I/O) hub 1320, an I/O controller hub 1330, a memory device 1340, and a graphic card 1350. In some embodiments, the computing system 1300 may be any arbitrary computing system, such as a personal computer (PC), a server computer, a workstation, a laptop, a mobile phone, a smartphone, a PDA, a PMP, a digital camera, a digital television, a set-top box, a music player, a portable game console, or a navigation system.

The processor 1310 may perform various computing functions, such as calculations or tasks. For example, the processor 1310 may be a microprocessor or a central processing unit (CPU). In some embodiments, the processor 1310 may include one processor core (single core) or a plurality of processor cores (multi-core). For example, the processor 1310 may include a dual-core, a quad-core, or a hexa-core. Also, although the computing system 1300 of FIG. 13 includes one processor 1310, in some embodiments, the computing system 1300 may include a plurality of processors. Also, in some embodiments, the processor 1310 may further include an internal or external cache memory.

The processor 1310 may include a memory controller 1311 for controlling an operation of the memory device 1340. The memory controller 1311 included in the processor 1310 may be referred to as an integrated memory controller (IMC). In some embodiments, the memory controller 1311 may be located in the I/O hub 1320. The I/O hub 1320 including the memory controller 1311 may be referred to as a memory controller hub (MCH).

The memory device 1340 includes a memory cell array 1342 and a refresh controller 1344 for refreshing memory cells of the memory cell array 1342. The refresh controller 1344 may generate the free-running refresh clock signal REF_CLK so that self-refresh may be performed. The refresh controller 1344 may change a cycle of the refresh clock signal REF_CLK so that a start time of self-refresh to be performed in response to the SRE command may be changed, may change a cycle of the refresh clock signal REF_CLK so that self-refresh may not be performed when the SRE command is received, and may set a first refresh cycle of the refresh clock signal REF_CLK before self-refresh and a second refresh cycle of the refresh clock signal REF_CLK after self-refresh to be different from each other. The refresh controller 1344 may allow extra refresh by a memory controller or extra refresh by the memory device itself to be performed in response to no self-refresh.

The I/O hub 1320 may manage data transmission between devices, such as the graphic card 1350, and the processor 1310. The I/O hub 1320 may be connected to the processor 1310 via various types of interfaces. For example, the I/O hub 1320 and the processor 1310 may be connected via various standards of interfaces, such as a front side bus (FSB), a system bus, HyperTransport, Lightning Data Transport (LDT), QuickPath Interconnect (QPI), Common System Interface (CSI), or Peripheral Component Interconnect Express (PCIe). Although the computing system 1300 of FIG. 13 includes one I/O hub 1320, in some embodiments, the computing system 1300 may include a plurality of I/O hubs.

The I/O hub 1320 may provide various interfaces with devices. For example, the I/O hub 1320 may provide Accelerated Graphics Port (AGP) interface, PCIe, or Communication Streaming Architecture (CSA) interface.

The graphic card 1350 may be connected to the I/O hub 1320 via AGP or PCIe. The graphic card 1350 may control a display device for displaying an image. The graphic card 1350 may include an internal processor for processing image data and an internal semiconductor memory device. In some embodiments, the I/O hub 1320 may include a graphics device therein together with the graphic card 1350 located on the outside of the I/O hub 1320 or instead of the graphic card 1350. The graphics device included in the I/O hub 1320 may be referred to as integrated graphics. Also, the I/O hub 1320 including a memory controller and a graphics device may be referred to as a graphics and memory controller hub (GMCH).

The I/O controller hub 1330 may perform data buffering and interface relay so that various system interfaces operate efficiently. The I/O controller hub 1330 may be connected to the I/O hub 1320 via an internal bus. For example, the I/O hub 1320 and the I/O controller hub 1330 may be connected to each other via a direct media interface (DMI), a hub interface, an enterprise southbridge interface (ESI), or PCIe.

The I/O controller hub 1330 may provide various interfaces with peripheral devices. For example, the I/O controller hub 1330 may provide a universal serial bus (USB) port, a serial advanced technology attachment (SATA) port, a general purpose input/output (GPIO), a low pin count (LPC) bus, a serial peripheral interface (SPI), Peripheral Component Interconnect (PCI), or PCIe.

In some embodiments, two or more components from among the processor 1310, the I/O hub 1320, and the I/O controller hub 1330 may be realized as one chipset.

While the inventive concept has been particularly shown and described with reference to exemplary embodiments thereof, it will be understood that various changes in form and details may be made therein without departing from the spirit and scope of the following claims.

What is claimed is:

1. A method of refreshing a memory device, the method comprising:
    performing a normal refresh operation on memory cell rows of the memory device in response to a refresh command received from an external source;
    performing a self-refresh operation on the memory cell rows according to a refresh clock signal generated by a refresh clock signal generator of the memory device, the refresh clock signal providing a timing of a refresh period of the memory cell rows during a self-refresh period extending between a self-refresh enter command received from the external source and a self-refresh exit command received from the external source; and
    changing a cycle of the refresh clock signal,
    wherein the refresh clock signal has a first self-refresh cycle before the self-refresh operation begins and a second self-refresh cycle after the self-refresh operation begins, where durations of the first self-refresh cycle and the second self-refresh cycle are different from each other, and
    wherein a start time of the self-refresh operation is responsive to the change of the cycle of the refresh clock signal.

2. The method of claim 1, wherein the second self-refresh cycle is longer than the first self-refresh cycle.

3. The method of claim 1, further comprising resetting the refresh clock signal during a normal refresh period immediately prior to the self-refresh period in response to the refresh command received from the external source.

4. The method of claim 1, further comprising restarting a cycle of the refresh clock signal, wherein the self-refresh operation is the first self-refresh operation performed during the self-refresh period, wherein the start time of the self-refresh operation occurs after a delay from receipt of the self-refresh enter command.

5. The method of claim 1, wherein the normal refresh operation is performed within a standard refresh period of the memory device.

6. The method of claim 1, further comprising:
    receiving an extra refresh command from the external source between the self-refresh exit command and a second self-refresh enter command; and
    performing an extra refresh operation in response to the extra refresh command.

7. A method of refreshing a memory device, the method comprising:
    performing normal refresh operation to refresh memory cell rows of the memory device in response to the memory device receiving a refresh command;
    generating a refresh clock signal by a refresh clock signal generator of the memory device;
    entering a self-refresh mode in response to the memory device receiving a self-refresh enter command, wherein, when the memory device is in the self-refresh mode, the memory device is responsive to a timing of the refresh clock signal to perform a self-refresh operation to refresh memory cell rows of the memory device;
    exiting the self-refresh mode in response to the memory device receiving a self-refresh exit command; and
    determining that no self-refresh operation was performed during the self-refresh mode and generating a flag signal indicating no self-refresh operation was performed during the self-refresh mode.

8. The method of claim 7, further comprising:
    providing the flag signal to a memory controller external to the memory device;
    receiving, from the memory controller, the refresh command issued in response to the flag signal; and
    performing a refresh operation to refresh the memory cell rows according to the refresh command.

9. The method of claim 7, further comprising:
    when the self-refresh exit command is received, counting first logic sections of the refresh clock signal; and
    when a count value of the refresh clock signal is equal to a preset value or greater, performing, by the memory device itself, an extra refresh operation.

10. The method of claim 7, wherein the refresh clock signal is free-run and has its cycle reset in response to a normal refresh operation.

11. The method of claim 7, wherein the refresh clock signal has a first self-refresh cycle initiated before entering the self-refresh mode and a second self-refresh cycle immediately following the first self-refresh cycle initiated after entering the self-refresh mode.

12. The method of claim 11, wherein the second self-refresh cycle is longer than the first self-refresh cycle.

13. The method of claim 7, wherein a cycle of the refresh clock signal is restarted prior to a completion of the cycle of the refresh clock signal, wherein a start time of the self-refresh operation to be performed in response to the self-refresh enter command is changed in response to the restarting of the cycle of the refresh clock signal.

14. The method of claim 7, wherein the normal refresh operation is performed within a standard refresh period of the memory device.

15. A method of operating a memory device, comprising:
    operating the memory device in a self-refresh mode including during a first self-refresh period;
    operating the memory device in a normal refresh mode including during a first normal refresh period;
    generating a refresh clock with a refresh clock signal generation circuit of the memory device;
    during the first normal refresh period, in response to receiving a first external refresh command, resetting the refresh clock to interrupt a first cycle of the refresh clock and start a second cycle of the refresh clock;
    prior to completion of the second cycle of the refresh clock, initiating the first self-refresh period in response to receiving an enter self-refresh command; and
    in response to completion of the second cycle of the refresh clock, performing a first self-refresh operation of memory cell rows of the memory device.

16. The method of claim 15, wherein the refresh clock has the second cycle before the first self-refresh operation begins and a third cycle after the first self-refresh operation begins, where durations of the second cycle and the third cycle of the refresh clock are different from each other.

17. The method of claim 16, wherein the third cycle of the refresh clock signal is longer than the second cycle of the refresh clock signal.

18. The method of claim 15, further comprising:
determining that no self-refresh operation was performed during the self-refresh mode and generating a flag signal indicating no self-refresh operation was performed during the self-refresh mode.

19. The method of claim 18, further comprising:
providing the flag signal to a memory controller external to the memory device;
receiving, from the memory controller, a second external refresh command issued in response to the flag signal; and
performing an extra refresh operation to refresh the memory cell rows according to the second external refresh command.

\* \* \* \* \*